United States Patent
Yamakage

[11] Patent Number: 5,518,595
[45] Date of Patent: May 21, 1996

[54] FOCUSED ION BEAM ETCHING APPARATUS

[75] Inventor: Yasuhiro Yamakage, Kyoto, Japan

[73] Assignee: Shimadzu Corporation, Kyoto, Japan

[21] Appl. No.: 385,638

[22] Filed: Feb. 8, 1995

Related U.S. Application Data

[62] Division of Ser. No. 105,978, Aug. 13, 1993, abandoned, which is a continuation of Ser. No. 765,230, Sep. 21, 1991, abandoned.

[30] Foreign Application Priority Data

Sep. 28, 1990 [JP] Japan ..................... 2-261516

[51] Int. Cl.⁶ .............. C23C 14/46; B23K 15/00
[52] U.S. Cl. ................. 204/192.34; 204/298.36; 216/66
[58] Field of Search .............. 204/192.36, 192.34, 204/298.36; 250/492.3; 216/63, 66

[56] References Cited

U.S. PATENT DOCUMENTS

| Re. 33,193 | 4/1990 | Yamaguchi et al. ............ | 250/309 |
|---|---|---|---|
| 4,457,803 | 7/1984 | Takigawa ................. | 204/298.36 |
| 4,659,449 | 4/1987 | Watanabe ................. | 204/298.36 |
| 4,874,460 | 10/1989 | Nakagawa et al. .......... | 204/298.36 |
| 4,901,667 | 2/1990 | Suzuki et al. ............. | 204/298.36 |
| 5,035,787 | 7/1991 | Parker et al. ............. | 204/298.36 |

OTHER PUBLICATIONS

Patent Abstracts of Japan, vol. 7, No. 69 (C–158–23) 23 Mar. 1983 & JP–A–58 003973, 10 Jan. 1993. English translation.

Patent Abstracts of Japan, vol. 11, No. 304 (E–545) 3 Oct. 1987 & JP–A–62 097 242, 6 May 1987. English translation.

Patent Abstracts of Japan, vol. 14, No. 455, 28 Sep. 1990 & JP–A–2 181 923, 16 Jul. 1990. English translation.

Patent Abstracts of Japan, vol. 13, No. 513, 16 Nov. 1989 & JP–A–1 208 834, 22 Aug. 1989. English translation.

International Publication No. WO 88 09049; International Publication Date: 17 Nov. 1988.

Chemically enhanced focused ion beam etching of deep groves and laser–mirror facets in GaAs under $Cl_2$ gas irradiation using a fine nozzle, Appl. Phys. Lett. 50 (26), 29 Jun. 1987.

*Primary Examiner*—Nam Nguyen
*Attorney, Agent, or Firm*—Armstrong, Westerman, Hattori, McLeland & Naughton

[57] ABSTRACT

An apparatus for effecting micro fabrication of wafer surfaces by emitting a focused ion beam thereto, in which a gas is jetted through a gas introducing pipe to an ion emitter whereby the gas is adsorbed to an emitter surface. A potential difference is applied between the emitter and an extraction electrode to extract ions. The ions are then accelerated and focused into a focused ion beam having an etching function. The focused ion beam is deflected by a deflecting electrode to form a predetermined pattern. The focused ion beam is decelerated by action of a decelerating electrode prior to impingement on a wafer under treatment. Consequently, a wafer surface is etched to define the predetermined pattern without damage to the wafer surface.

6 Claims, 2 Drawing Sheets

FOCUSED ION BEAM ETCHING APPARATUS

This is a division of application Ser. No. 08/105,978 filed Aug. 13, 1993 abandoned, which is a continuation of application Ser. No. 07/765,230 filed Sep. 21, 1991 abandoned.

BACKGROUND OF THE INVENTION (1) Field of the Invention

The present invention relates to focused ion beam etching apparatus using a focused ion beam to form or modify patterns, directly and without using masks, on wafer surfaces in a semiconductor device manufacturing process.

(2) Description of the Related Art

A known focused ion beam etching apparatus has a construction as shown in FIG. 1.

This apparatus includes a sample chamber 101 in which a wafer 102 is placed for processing, the sample chamber 101 being decompressed by an exhaust unit 105. The apparatus etches the wafer 102 by directing thereto a focused $Ga^+$ ion beam 103 with an accelerating voltage of 30 keV along with chlorine ($Cl_2$) gas acting as an etching gas. The chlorine gas is sprayed to the wafer 102 through a fine nozzle 104.

With such an etching apparatus using a focused ion beam, wafer surfaces are vulnerable to damage by the accelerated ions. There is a further disadvantage that the sample chamber 101 and wafer 102 tend to be contaminated by the etching gas such as chlorine gas directly introduced into the sample chamber 101.

SUMMARY OF THE INVENTION

The present invention has been made having regard to the state of the art noted above, and its object is to provide a focused ion beam etching apparatus for etching wafers without damaging their surfaces and without contaminating a sample chamber and a wafer.

The above object is fulfilled, according to the present invention, by an apparatus for effecting micro fabrication of wafer surfaces by emitting a focused ion beam thereto, the apparatus comprising:

a vacuum chamber, a field ionization type ion source disposed in one end of the vacuum chamber and having a gas introducing pipe, an ion beam extracting device for extracting ions having a chemical etching function from the ion source and focusing the ions into an ion beam, a deflecting device for directing the ion beam in a predetermined pattern on a surface of a wafer under treatment, a decelerating device for decelerating the ion beam to a predetermined energy for impingement on the wafer surface, and a sample section disposed in the other end of the vacuum chamber for accommodating the wafer to which the ion beam is directed in deceleration.

According to the present invention, ions having a chemical etching function are extracted from the field ionization type ion source, focused into an ion beam, decelerated to a predetermined energy, and directed in a predetermined pattern to a wafer surface under treatment.

The wafer surface is free from damage since the decelerated focused ion beam is used to etch the wafer surface. Moreover, since the ions having an etching function are extracted directly from the field ionization type ion source for use in etching, an etching gas need not be introduced into the sample section. Thus, the possibility of contaminating the sample section and wafer is precluded.

BRIEF DESCRIPTION OF THE DRAWINGS

For the purpose of illustrating the invention, there is shown in the drawings a form which is presently preferred, it being understood, however, that the invention is not limited to the precise arrangements and instrumentalities shown.

DETAILED DESCRIPTION OF THE PREFERRED EMBODIMENT

A preferred embodiment of the present invention will be described in detail with reference to the drawings.

Figure 2:
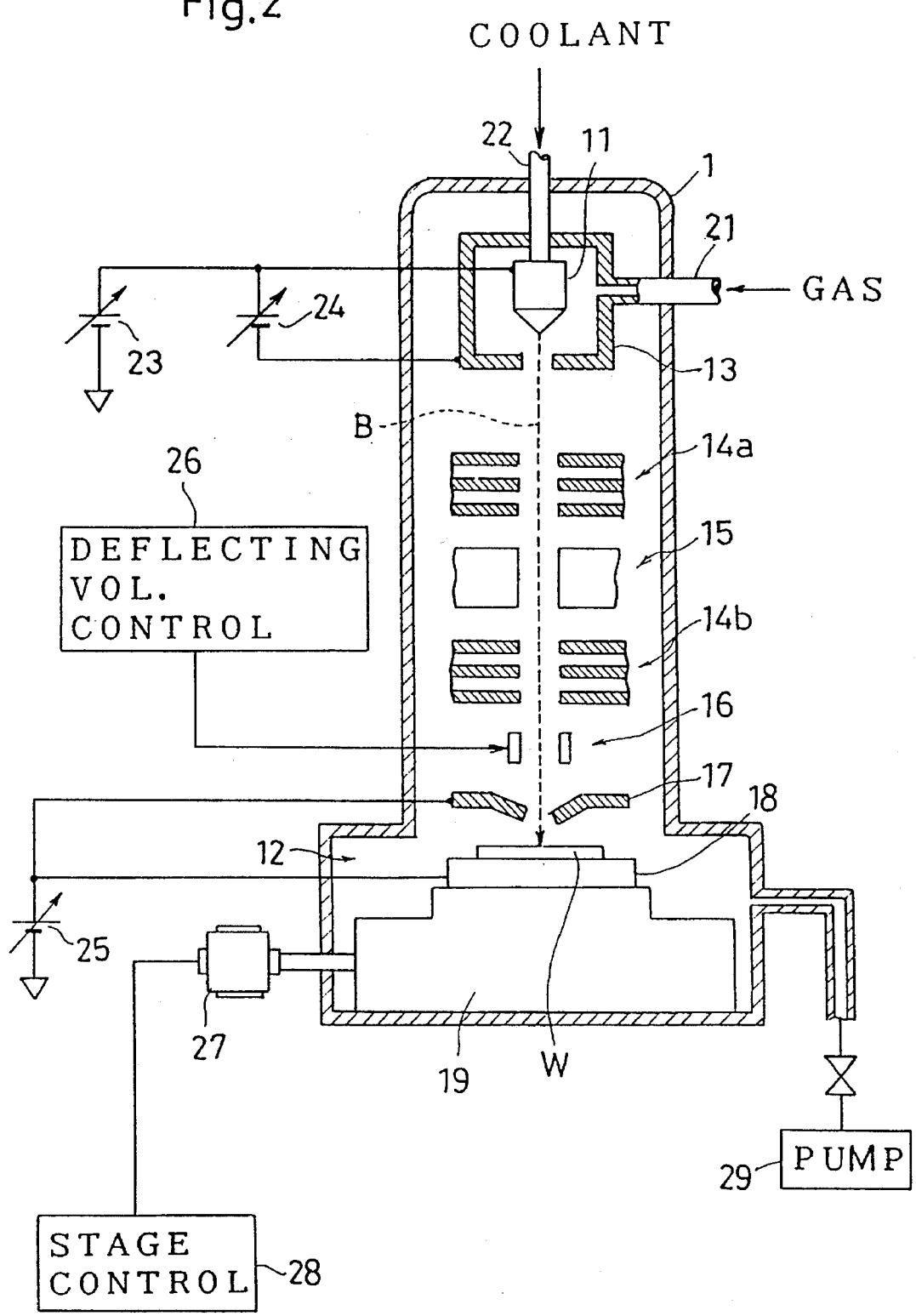
FIG. 2 is a schematic view of a focused ion beam etching apparatus according to the present invention.

Referring to FIG. 2, the focused ion beam etching apparatus shown therein comprises a vacuum chamber 1. The vacuum chamber 1 includes a gas ion emitter 11 of the field ionization type disposed in one end region thereof, and a sample section 12 disposed in the other end region for accommodating a wafer W to be processed.

The vacuum chamber 1 further includes a pipe 21 connected to the end region where the emitter 11 is disposed, for introducing a gas from a gas source not shown, from which ions are extracted by field ionization. A cooling pipe 22 is connected to the emitter 11 for supplying a cooling medium such as liquid helium to cause adsorption of the gas introduced through the pipe 21.

The vacuum chamber 1 includes, arranged in the stated order through a region from the emitter 11 to the sample section 12, an extraction electrode 13 for extracting the ions from the emitter 11, a first electrostatic lens 14a for focusing the ions into a beam, a mass filter 15, a second electrostatic lens 14b, a deflecting electrode 16 for directing the focused ion beam in a predetermined pattern to the wafer W, and a decelerating electrode 17 for reducing the focused ion beam to a predetermined energy.

The wafer W is placed on a sample stage 18 in the sample section 12. The sample stage 18 is mounted on an XY stage 19 movable on a horizontal plane.

The focused ion beam etching apparatus in this embodiment further includes an accelerating power source 23 of about 30–50 kV for applying an accelerating energy to the ions, an extraction power source 24 of several tens of kV to apply a potential difference between the emitter 11 and electrode 13, and a decelerating power source 25 of fine adjustable voltage for generating voltage up to a maximum corresponding to that of the accelerating power source 23. Numeral 26 in FIG. 2 denotes a deflecting voltage control unit for applying a deflecting voltage to the deflecting electrode 16. Numeral 27 denotes a motor for driving the XY stage 19. Numeral 28 denotes a stage movement control unit for controlling the motor 27. Numeral 29 denotes an exhaust device for decompressing the vacuum chamber 1.

In the focused ion beam etching apparatus constructed as above, an ion beam B extracted from the ion emitter 11 is focused by the electrostatic lenses 14a and 14b, and ions are selected through the mass filter 15 for entry to the sample section 12. The energy of the focused ion beam B reaching the wafer W on the sample stage 18 is equal to a difference in output voltage between the accelerating power source 23 and decelerating power source 25.

That is, the focused ion beam B retains the energy applied by the accelerating power source 23 until the beam B approaches the decelerating electrode 17. When the potential of the decelerating electrode 17 and sample stage 18 is increased by the decelerating power source 25, the focused ion beam B impinging on the wafer W is decelerated by an amount corresponding to the potential increase.

Consequently, the energy of the focused ion beam B reaching the wafer W may be varied steplessly by adjusting the output of the decelerating power source 25, in theory from zero output to full output of the accelerating power source 23.

By using such focused ion beam B, an wafer surface may be etched free from damage with the ions decelerated to a degree to cause no damage to the wafer W, e.g. to 50–100 eV. By using chlorine ($Cl_2$) gas or fluorine ($SF_6$) gas as the ion producing gas, chlorine ions or fluorine ions may be generated for use in etching the surface of a gallium arsenide (GaAs) wafer or a silicon (Si) wafer. Chlorine ions are used for the former wafer, while chlorine ions or fluorine ions are used for the latter.

Moreover, since the focused ion beam itself has a chemical etching function, it is unnecessary to introduce an etching gas toward the wafer W as in the conventional apparatus. Thus, the sample section 12 and wafer W are free from contamination.

Figure 1:
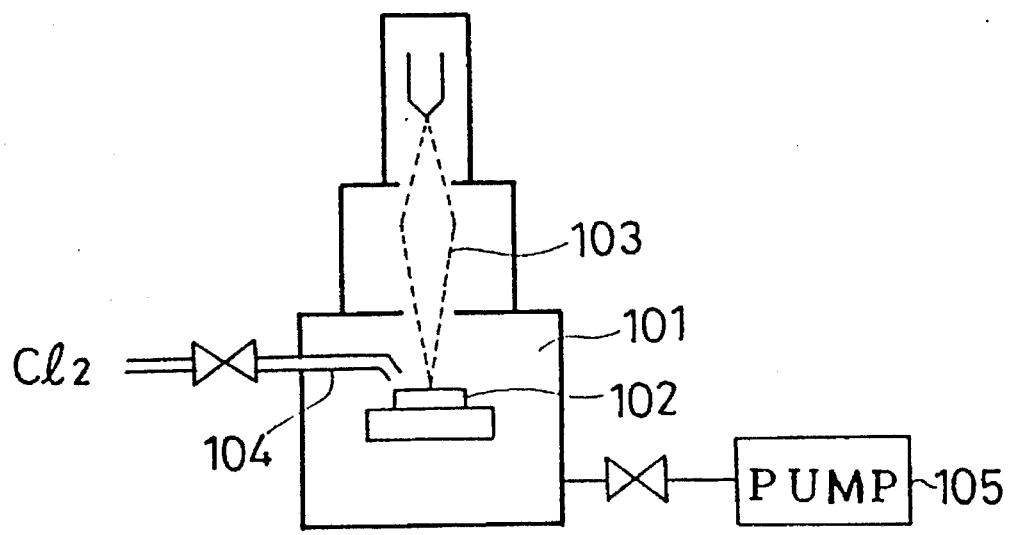
FIG. 1 is a schematic view of a known focused ion beam etching apparatus.
Figure 3:
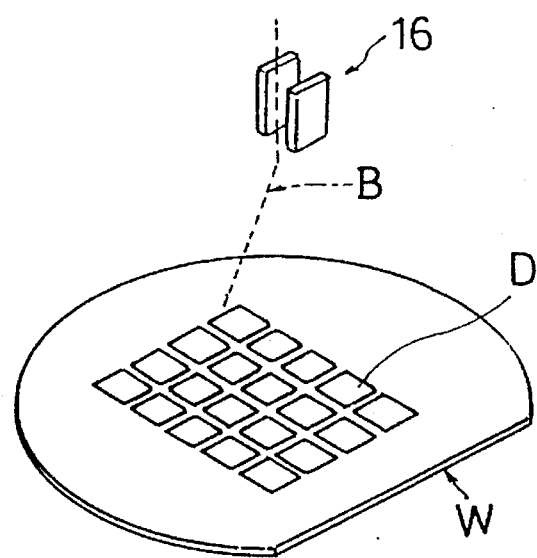
FIG. 3 is an explanatory view of an operation of the apparatus shown in FIG. 2.

There is a limitation to pattern formation on the wafer by deflecting the focused ion beam B only by means of the deflecting electrode 16. Where it is necessary to form patterns over a wide area of the wafer, the stage movement control unit 28 is actuated to apply a control signal to the motor 27 to move the XY stage 19. In this way, the wafer W is moved with the sample stage 18 to enable fine patterns to be formed on selected positions of the wafer W. Positions of the sample stage 18 are determined accurately by means of a measuring machine such as a laser interferometer. As shown in FIG. 3, for example, movement from one to another of numerous divisions D on the wafer W may rely on the XY stage 19, while a fine pattern may be formed within each division D by driving the deflecting electrode 16.

The present invention may be embodied in other specific forms without departing from the spirit or essential attributes thereof and, accordingly, reference should be made to the appended claims, rather than to the foregoing specification, as indicating the scope of the invention.

What is claimed is:

1. An etching method using a focused ion beam, comprising the steps of:

directing halogen gas to a cooled field ionization type emitter disposed in one end region of a vacuum chamber;

obtaining a focused ion beam having a chemical etching function by extracting halogen ions from said emitter by field ionization and accelerating and focusing said halogen ions;

deflecting said focused ion beam in a predetermined pattern;

decelerating said focused ion beam before impingement on a sample surface; and allowing said focused ion beam to impinge in deceleration on said sample surface disposed in the other end of said vacuum chamber.

2. A method as claimed in claim 1, wherein said halogen gas is chlorine gas.

3. A method as claimed in claim 1, wherein said halogen gas is fluorine gas.

4. A method as claimed in claim 1, wherein desired ions are selected by a mass filter from said focused ion beam obtained by extracting halogen ions from said emitter by field ionization and accelerating and focusing said halogen ions.

5. A method as claimed in claim 1, wherein said focused ion beam is decelerated to have an energy level, when reaching said sample surface, lower than an energy level causing damage to said sample surface.

6. A method as claimed in claim 1, wherein said sample surface is moved in a horizontal plane for allowing said focused ion beam to impinge on selected positions of said sample surface, and deflecting said focused ion beam on said selected positions, thereby to form fine patterns on said selected positions.

* * * * *